(12) United States Patent
Ma et al.

(10) Patent No.: US 10,868,075 B2
(45) Date of Patent: Dec. 15, 2020

(54) DUAL-DEVICE PHOTOSENSITIVE DETECTION UNIT BASED ON COMPOSITE DIELECTRIC GATE, DETECTOR AND METHOD THEREOF

(71) Applicant: NANJING UNIVERSITY, Jiangsu (CN)

(72) Inventors: Haowen Ma, Jiangsu (CN); Feng Yan, Jiangsu (CN); Xiaofeng Bu, Jiangsu (CN); Chen Shen, Jiangsu (CN); Limin Zhang, Jiangsu (CN); Cheng Yang, Jiangsu (CN); Cheng Mao, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 156 days.

(21) Appl. No.: 16/320,908

(22) PCT Filed: Oct. 20, 2016

(86) PCT No.: PCT/CN2016/102679
§ 371 (c)(1),
(2) Date: Jan. 25, 2019

(87) PCT Pub. No.: WO2018/018762
PCT Pub. Date: Feb. 1, 2018

(65) Prior Publication Data
US 2019/0172866 A1    Jun. 6, 2019

(30) Foreign Application Priority Data
Jul. 25, 2016    (CN) .......................... 2016 1 0592997

(51) Int. Cl.
*H01L 27/14*    (2006.01)
*H01L 27/146*   (2006.01)

(52) U.S. Cl.
CPC .... *H01L 27/14643* (2013.01); *H01L 27/1461* (2013.01); *H01L 27/1463* (2013.01);
(Continued)

(58) Field of Classification Search
CPC ........... H01L 27/14643; H01L 27/1461; H01L 27/1463; H01L 27/14614; H01L 27/14603; H01L 27/14621; H01L 27/14627
See application file for complete search history.

(56) References Cited

U.S. PATENT DOCUMENTS 9,431,449 B2 * 8/2016 Toda ................. H01L 27/14605
10,103,287 B2 * 10/2018 Hsu ..................... H01L 27/1461
(Continued)

FOREIGN PATENT DOCUMENTS

CN    101715041 A    5/2010
CN    102800593 A    11/2012
(Continued)

*Primary Examiner* — Tony Ko
(74) *Attorney, Agent, or Firm* — Novick, Kim & Lee, PLLC; Allen Xue

(57) ABSTRACT

A photosensitive detection unit has a composite dielectric gate MOS-C portion and a composite dielectric gate MOSFET portion. The two portions are formed above a same P-type semiconductor substrate, and share a charge coupled layer. A plurality of the photosensitive detection units are arranged on a same P-type semiconductor substrate in form of an array to obtain a detector. Adjacent unit pixels in the detector are isolated by deep trench isolation regions and P⁺-type injection regions below the isolation regions. During the detection, the P-type semiconductor substrate in the composite dielectric gate MOS-C portion senses light and then couples photoelectrons to the charge coupled layer, and photoelectronic signals are read by the composite dielectric gate MOSFET portion.

16 Claims, 12 Drawing Sheets

(52) U.S. Cl.
CPC .. *H01L 27/14614* (2013.01); *H01L 27/14603* (2013.01); *H01L 27/14621* (2013.01); *H01L 27/14627* (2013.01)

(56) References Cited

U.S. PATENT DOCUMENTS

| | | | |
|---|---|---|---|
| 10,332,926 B2 * | 6/2019 | Ni | H01L 27/1464 |
| 2004/0251482 A1 * | 12/2004 | Rhodes | H01L 27/14683 257/292 |
| 2012/0085888 A1 | 4/2012 | Endo et al. | |

FOREIGN PATENT DOCUMENTS

| | | |
|---|---|---|
| CN | 102938409 A | 2/2013 |
| CN | 103066097 A | 4/2013 |

\* cited by examiner

DUAL-DEVICE PHOTOSENSITIVE DETECTION UNIT BASED ON COMPOSITE DIELECTRIC GATE, DETECTOR AND METHOD THEREOF

TECHNICAL FIELD OF THE INVENTION

The present invention relates to an imaging detector, particularly to a structure, operating mechanism and signal readout of an imaging detector in an infrared band, a visible light band and an ultraviolet band, specifically a dual-device photosensitive detection unit based on a composite dielectric gate, a detector and a signal reading method thereof.

BACKGROUND OF THE INVENTION

Imaging detectors have been widely applied in various fields such as military and civilian. The currently developed imaging detectors are mainly CCDs and CMOS-APSs. The CCDs have been developed early and their development processes are relatively mature. The basic structure of a CCD includes multiple columns of MOS capacitors connected in series. The generation and change of potential wells on a surface of a semiconductor are controlled by a voltage pulse sequence on the capacitors, so that the storage, transfer and readout of photo-generated charge signals are realized. Exactly due to this signal transfer characteristic, the speed of charge transfer is very limited, so that the imaging speed is low. In addition, since the capacitors are connected in series, the transmission of signals in the entire row will be influenced if one capacitor goes wrong. Therefore, the technological requirements are very high, and the yield and cost are unsatisfactory. For the CMOS-APSs, each pixel consists of a diode and a transistor and the pixels are independent of each other, it is unnecessary to move the charge in series during the whole signal transmission, and the performance of other pixels will not be influenced if a certain pixel goes wrong. Therefore, the deficiency of the CCDs in this respect is overcome, and the technological requirements are not so high. The CMOSs adopt single-point signal transmission. By a simple X-Y addressing process, it is allowed to read data from the whole array, a part or even a unit. Thus, the addressing speed is improved and faster signal transmission is realized. However, each pixel in the CMOS-APS consists of a plurality of transistors and one photodiode (containing an amplifier and an A/D converter circuit), so that a photosensitive region of each pixel occupies only a very small surface area of the pixel. As a result, both the sensitivity and the resolution are relatively low.

By comparison, it is found that the two conventional imaging detection technologies have respective advantages and disadvantages. The CMOS-APSs have been rapidly developed in recent years with the continuous progress of the CMOSs and exhibit a promising prospect. The development of an imaging detector that is based on CMOSs and can overcome the disadvantages of the conventional CMOS-APSs as far as possible is of great significance.

A desirable imaging device may be an array architecture consisting of CCD pixels and CMOS-APSs. This architecture has been considered as being applied to storage devices. In the currently envisaged structure of a floating gate memory device, a gate is additionally provided between a control gate and a channel in the conventional MOS structure. This gate is surrounded by dense oxides and not connected to the outside, so it is called a floating gate.

Chinese Patent No. CN96122772.9 entitled "SEMICONDUCTOR MEMORY DEVICE AND MANUFACTURING METHOD THEREOF" has disclosed a memory device using a floating gate architecture, wherein a control gate is provided on the floating gate, and electrons are injected into the floating gate in a dense oxide layer due to a certain electric field and by the tunneling effect of the electrons. An imaging device may be directly manufactured by this effect, referring to Patent No. WO2010/094233.

However, since the imaging efficiency of this imaging mechanism is closely related to the gate oxide electric field, there will be a significant saturation effect as the light intensity increases. This saturation effect means that the gate oxide electric field will gradually decrease as the amount of electrons collected by the floating gate increases; in turn, the efficiency of collection of electrons by the floating gate will be reduced. After the efficiency of collection of electrons by the floating gate becomes lower and lower and decreases to a certain extent, the gate oxide electric field cannot reach the magnitude of the electric field required by the tunneling effect, and the collection of electrons will be stopped. Moreover, in low light, since the voltage drop between the control gate and the substrate is mainly concentrated in a depletion region, the gate oxide electric field is not enough to generate the tunneling effect. Therefore, there is no good low-light detection response. Meanwhile, the electrons cannot be 100% transferred from the channel to the floating gate. As a result, the collected photoelectrons will be lost and thus the detection efficiency will be greatly reduced.

In addition, when a plurality of single floating gate detection units are integrated to obtain a floating gate detection array, the crosstalk between photoelectrons collected by different floating gate detection units will occur in a particular architecture. With reference to FIG. 7 in Patent No. WO2010/094233, a 3*3 floating gate unit array with an NOR architecture is shown. In the used connection architecture, source regions of nine floating gate units are all connected to a common source; and, since no voltage is applied to the common source during the operation, the voltages in the source regions of the nine floating gate units are the same and not fixed. After one floating gate detection unit is exposed, photoelectrons will be received, and its source region will evenly distribute a signal indicative of information about the photoelectrons to the nine floating gate units through the common source. In this way, during the detection of any one floating gate detection unit, a signal will be generated on all the detection units, so that the photosensitive detector is unable to work.

Chinese Patent No. CN201210442007.X has proposed a double-transistor solution to solve the crosstalk between photoelectronic signals. However, actually, the working principle of this imaging device is still based on the tunneling effect of electrons. Therefore, the problems of poor low-light response, obvious saturation effect and low detection efficiency cannot be solved.

SUMMARY OF THE INVENTION

An objective of the present invention is to provide a dual-device photosensitive detector based on a composite dielectric gate. Each detection unit of the detector includes a composite dielectric gate MOS-C portion and a composite dielectric gate MOSFET portion. The composite dielectric gate MOS-C portion senses light, and optical signals obtained by the MOS-C portion are coupled to the composite dielectric gate MOSFET portion by charge coupling for purpose of reading. Another objective of the present invention is to provide a detection method using the photosensitive detector. The light sensing and reading of the photosensitive detection are completed by two different devices. In this way, the detection of optical signals can be well realized, with advantages of good low-light response and linearity, no obvious saturation, high dynamic range and high quantum efficiency.

The present invention employs the following technical solutions.

A dual-device photosensitive detection unit based on a composite dielectric gate is provided, including a composite dielectric gate MOS-C portion having a light sensing function and a composite dielectric gate MOSFET portion having an information reading function, the two portions being formed above a same P-type semiconductor substrate; the composite dielectric gate MOS-C portion includes a charge coupled layer, a first top dielectric layer and a first control gate which are all successively stacked above the P-type semiconductor substrate, wherein an N-type injection layer is formed in the P-type semiconductor substrate and below the charge coupled layer; the composite dielectric gate MOSFET portion includes a bottom dielectric layer, the charge coupled layer, a second top dielectric layer and a second control gate which are all successively stacked above the P-type semiconductor substrate, wherein an N-type source region and an N-type drain region are formed in the P-type semiconductor substrate and on a side close to the bottom dielectric layer, and a threshold adjustment injection region is formed in the P-type semiconductor substrate and below the bottom dielectric layer; and, in the P-type semiconductor substrate, the N-type injection layer is isolated from the N-type source region and the N-type drain region by a shallow trench isolation region and a $P^+$-type injection region.

Further, the composite dielectric gate MOS-C portion further includes a first bottom dielectric layer which is disposed above the P-type semiconductor substrate and below the charge coupled layer.

The first bottom dielectric layer and the bottom dielectric layer in the composite dielectric gate MOSFET portion are connected to form an integral structure or are two independent parts, and the first top dielectric layer and the second top dielectric layer are connected to form an integral structure or are two independent parts.

The first control gate and the second control gate are connected to form an integral structure. Or, the first control gate and the second control gate are of a side-by-side double-gate structure, wherein the first control gate is a light-sensing control gate and the second control gate is a reading control gate.

The area of the P-type semiconductor substrate and the charge coupled layer in the composite dielectric gate MOS-C portion is greater than the area of the P-type semiconductor substrate and the charge coupled layer in the composite dielectric gate MOSFET portion.

The charge coupled layer is made of one of polycrystalline silicon, metal or other electronic conductors; the first control gate or the second control gate is made of one of polycrystalline silicon, metal or transparent conducting electrodes; the bottom dielectric layer is made of one of silicon oxide, SiON or other dielectrics with a high dielectric constant; and, the first top dielectric layer or the second top dielectric layer is made of one of silicon oxide/silicon nitride/silicon oxide, silicon oxide/aluminum oxide/silicon oxide, silicon oxide, aluminum oxide or other dielectrics with a high dielectric constant.

The present invention provides a dual-device photosensitive detector based on a composite dielectric gate which is formed by arranging a plurality of the dual-device photosensitive detection units on a same P-type semiconductor substrate in form of an array, wherein deep trench isolation regions and $P^+$-type injection regions are formed between the composite dielectric gate MOS-C portions to isolate the photosensitive detection units; the composite dielectric gate MOSFET portions are interconnected by an NOR architecture of a flash memory; connecting lines of the second control gates and connecting lines of the N-type drain regions are perpendicular to each other and used for selecting and reading the X-Y value; and, the common N-type source region is grounded during exposure.

The present invention provides a detection method using the dual-device photosensitive detector, wherein photosensitive photoelectrons are collected, stored and read by the composite dielectric gate MOS-C portion and the composite dielectric gate MOSFET portion, and change in potential of the charge coupled layer caused by the composite dielectric gate MOS-C portion during exposure can be measured by the composite dielectric gate MOSFET portion; and, the P-type semiconductor substrate in the composite dielectric gate MOS-C portion senses light and then couples photoelectrons to the charge coupled layer, and photoelectronic signals are read by the composite dielectric gate MOSFET portion.

In the present invention, the light sensing and reading functions of the photosensitive detector are separately realized by two devices, i.e., the composite dielectric gate MOS-C and MOSFET portions, so that the light sensing and reading functions of the photosensitive detector are separated. The present invention has the following characteristics and advantages.

(1) Low-light response: since the composite dielectric gate MOS-C and MOSFET portions of the photosensitive detector do not use the tunneling principle, the voltage is almost concentrated in the depletion region in the case of low light, resulting in a very low gate oxide electric field that will not influence the detection efficiency of the photosensitive detector. Meanwhile, the use of the double-gate structure can greatly improve the detection sensitivity of the photosensitive detector and is greatly beneficial to the detection of low light.

(2) Low saturation effect: since the composite dielectric gate MOS-C and MOSFET portions of the photosensitive detector do not use the tunneling principle, the detection efficiency is not related to the intensity of the electric field, so that the decrease in the electric field resulted from the collection of charges will not greatly influence the detection efficiency of the photosensitive detector and thus will not cause the saturation effect.

(3) No crosstalk between photosensitive units: since there is no source/drain injection into the photosensitive portion of the photosensitive detector, the transistors cannot be communicated to each other so that the transistors will not directly interfere with each other. Meanwhile, the MOS-C portions for sensing light in the detector array are isolated by deep trench isolation regions and $P^+$-type injection regions below the isolation regions, so the photo-charges collected by the MOS-C portions can be effectively prevented from interfering with each other to thus influence the imaging quality. Therefore, there is almost no crosstalk between the photosensitive units, and an image read by the photosensitive detector is basically the same as the real image.

(4) High quantum efficiency: The light sensing principle of the detector is similar to that of the CCDs, but the tunneling process is omitted and the loss of electrons during the tunneling process is thus avoided. Meanwhile, the substrates (on a side closed to the laminated dielectric) in the composite dielectric gate MOS-C and MOSFET portions are isolated by shallow trench isolation and P+-type injection, so that the photo-charges collected by the MOS-C portion can be prevented from leaking from the source region and the drain region in the MOSFET portion. Since the photoelectrons generated from photons entering the depletion region are almost collected in channels, the quantum efficiency is very high.

DETAILED DESCRIPTION OF THE INVENTION

The structure of a unit pixel of a charge-coupled photosensitive detector having a composite dielectric gate MOS-C portion and a composite dielectric gate MOSFET portion is shown in FIGS. 1-5. Each unit pixel of the detector consists of a composite dielectric gate MOS-C portion for sensing light and a composite dielectric gate MOSFET portion for reading. A light sensing function is realized by the composite dielectric gate MOS-C portion, and a reading function is realized by the composite dielectric gate MOSFET portion. Both the composite dielectric gate MOS-C portion and the composite dielectric gate MOSFET portion are formed above a same P-type semiconductor substrate.

Figure 1:
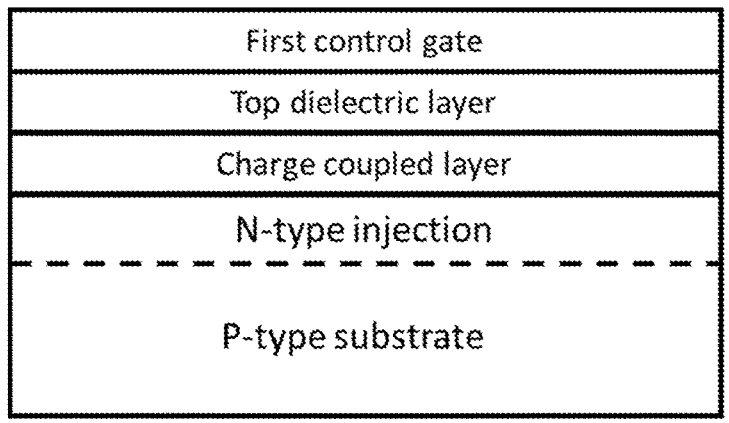
FIG. 1 is a schematic structure diagram of a light-sensing MOS-C portion of a detector.

The structure of the composite dielectric gate MOS-C portion for sensing light is shown in FIG. 1, including:
1) a P-type semiconductor substrate;
2) a bottom dielectric layer, a charge coupled layer, a top dielectric layer and a control gate which are all successively provided above the P-type semiconductor substrate; and
3) an N-type injection region which may be formed in the P-type semiconductor substrate (right below the laminated dielectric) by ion implantation and doping and used for moving down the storage position of photo-charges to leave an interface between the P-type semiconductor substrate and the top dielectric layer.

Figure 2:
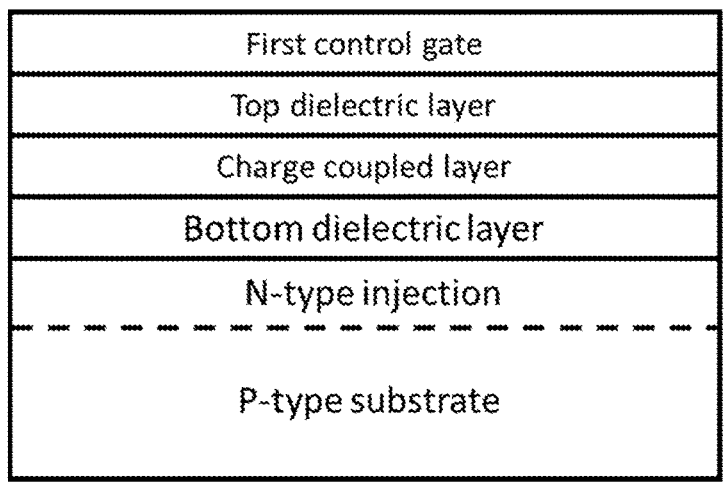
FIG. 2 is another schematic structure diagram of the light-sensing MOS-C portion of the detector.

Another structure of the composite dielectric gate MOS-C portion for sensing light is shown in FIG. 2, including:
1) a P-type semiconductor substrate;
2) a charge coupled layer, a top dielectric layer and a control gate which are all successively provided right above the P-type semiconductor substrate; and
3) an N-type injection layer which may be formed in the P-type semiconductor substrate (right below the laminated dielectric) by ion implantation and doping and used for moving down the storage position of photo-charges to leave an interface between the P-type semiconductor substrate and the top dielectric layer.

Figure 3:
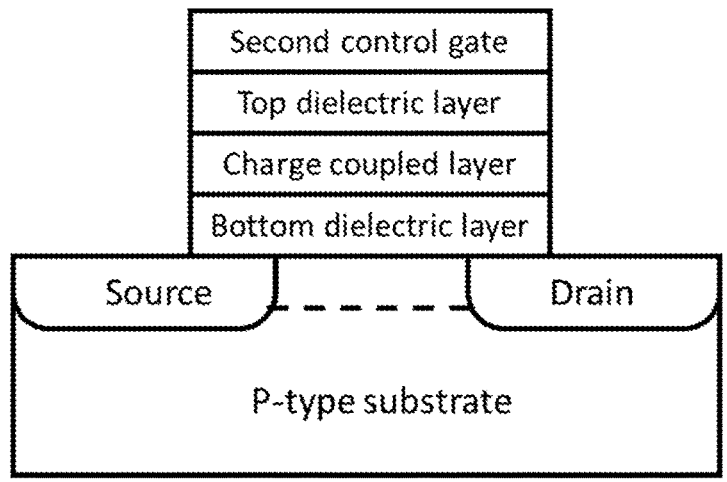
FIG. 3 is a schematic structure diagram of a reading MOSFET portion of the detector.

The structure of the composite dielectric gate MOSFET portion for reading is shown in FIG. 3, including:
1) a P-type semiconductor substrate;
2) a bottom dielectric layer, a charge coupled layer, a top dielectric layer and a control gate which are all successively provided right above the P-type semiconductor substrate;
3) an N-type source region and an N-type drain region which are formed in the P-type semiconductor substrate (on a side close to the laminated dielectric) by ion implantation and doping and used for reading signals from the photosensitive detector; and
4) a threshold adjustment injection region which may be formed in the P-type semiconductor substrate (right below the laminated dielectric) by ion implantation and doping and used for adjusting the threshold voltage at the composite dielectric gate MOSFET portion.

Figure 4:
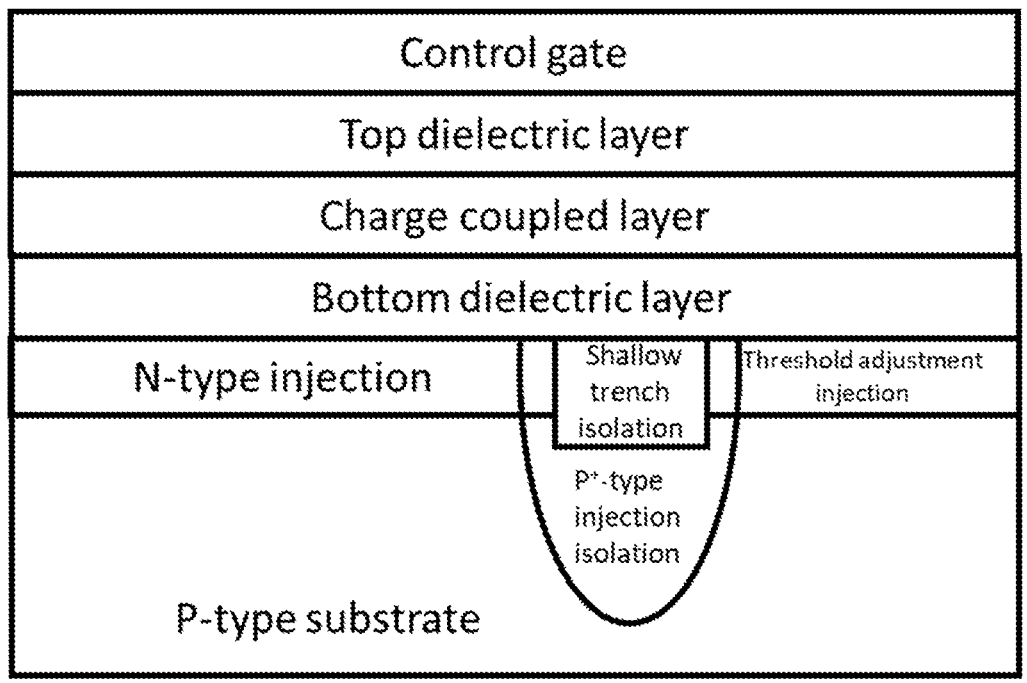
FIG. 4 is a schematic structure diagram of a unit pixel of the detector.
Figure 5:
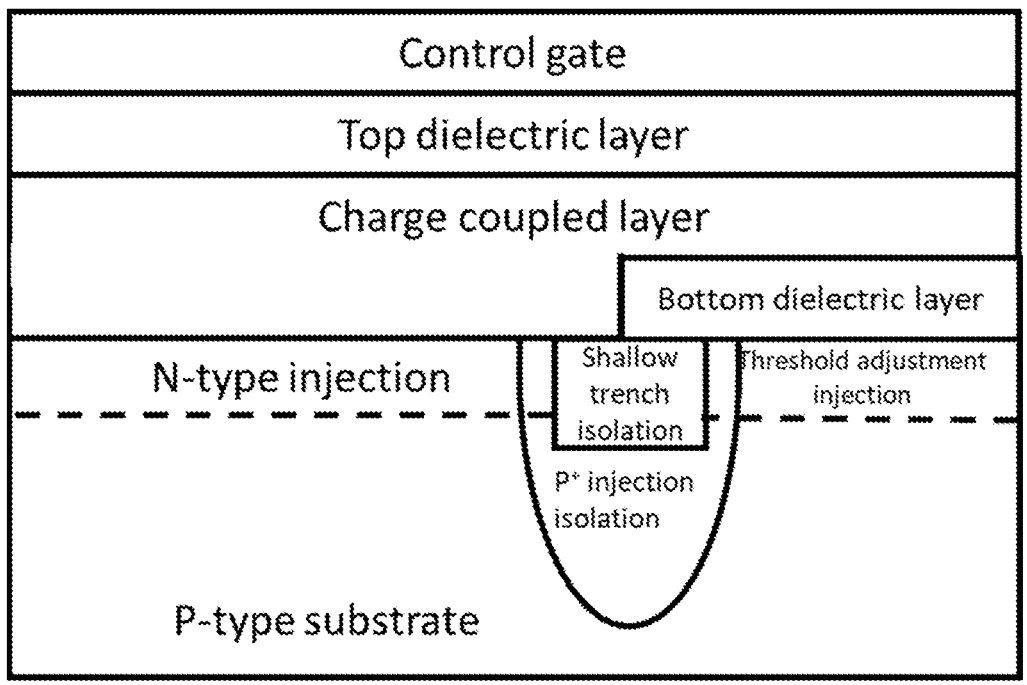
FIG. 5 is another structure diagram of the unit pixel of the detector.
Figure 6:
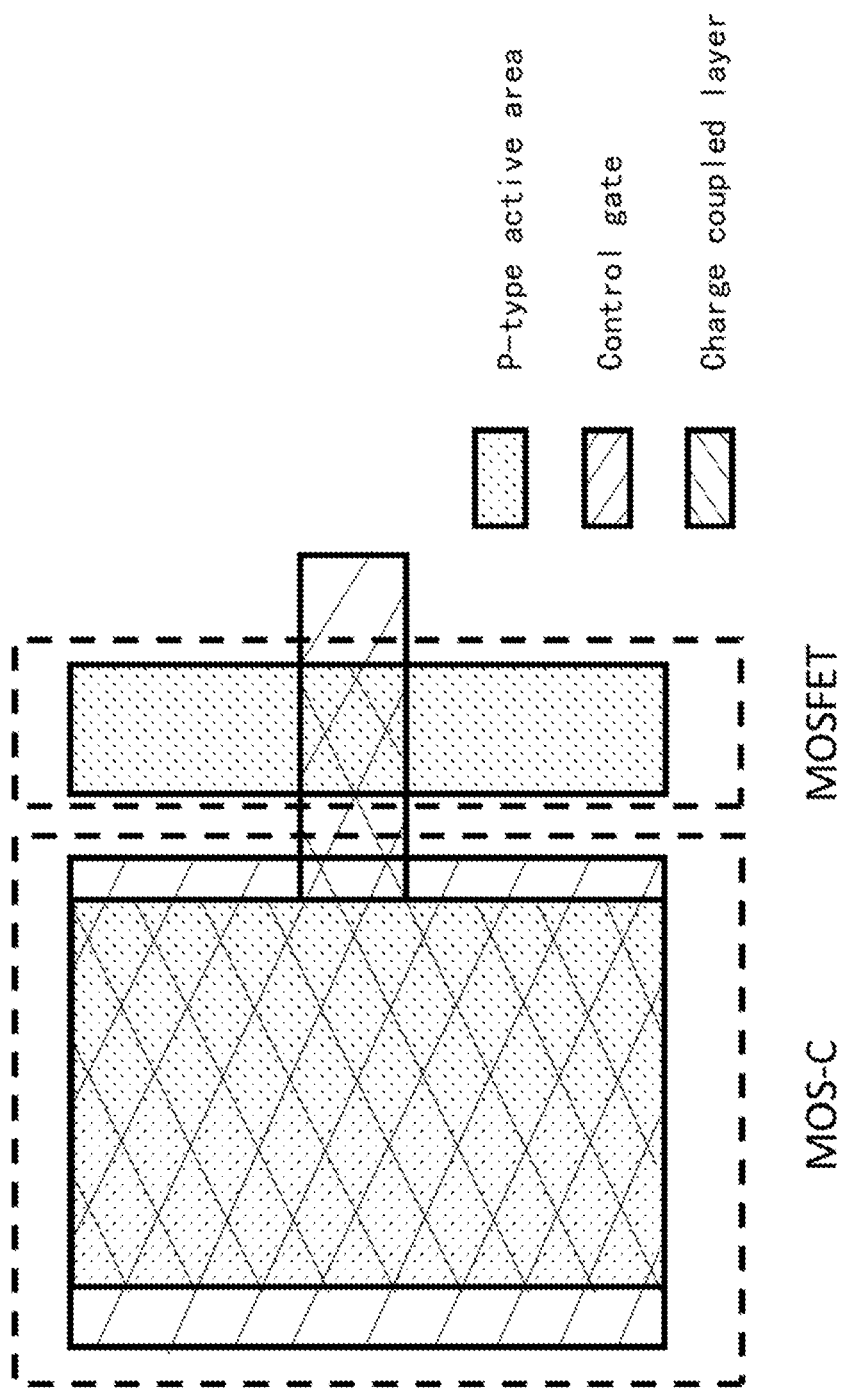
FIG. 6 is a layout diagram of unit pixels of the detector.

The connection method of the charge-coupled photosensitive detector having the composite dielectric gate MOS-C portion and the composite dielectric gate MOSFET portion is shown in FIGS. 4 and 5. The composite dielectric gate MOS-C portion and the composite dielectric gate MOSFET portion are connected by a same charge coupled layer and a substrate, so that the MOSFET portion for reading may read a same number of photo-charges as those sensed in the MOS-C portion for sensing light. The bottom dielectric layers and the control gates in both the composite dielectric gate MOS-C portion and the composite dielectric gate MOSFET portion are connected to form an integral structure, respectively. The substrates (on a side closed to the laminated dielectric) in the composite dielectric gate MOS-C and MOSFET portions are isolated by shallow trench isolation and deeper P+-type injection below the shallow trench isolation in order to prevent the photo-charges collected by the MOS-C portion from leaking from the source region and the drain region in the MOSFET portion, wherein the depth of the shallow trench isolation and the P+-type injection had better exceed the width of the depletion region so that the photo-charges collected by the MOS-C portion can be protected to the largest extent. The layout of unit pixels of the charge-coupled photosensitive detector having the composite dielectric gate MOS-C portion and the composite dielectric gate MOSFET portion is shown in FIG. 6, wherein the area of the MOS-C portion for sensing light is far greater than the area of the MOSFET portion for reading in order to increase the light-sensing area of the unit pixel of the photosensitive detector.

Figure 7:
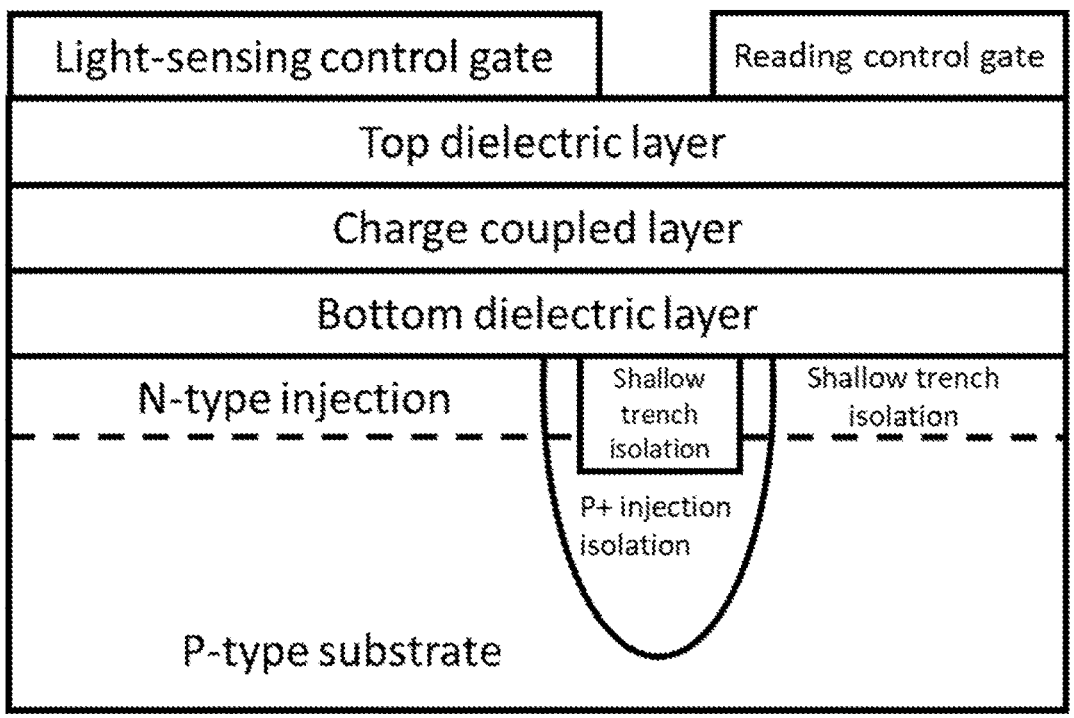
FIG. 7 is a first schematic structure diagram of a unit pixel of a double-gate structure of the detector.
Figure 8:
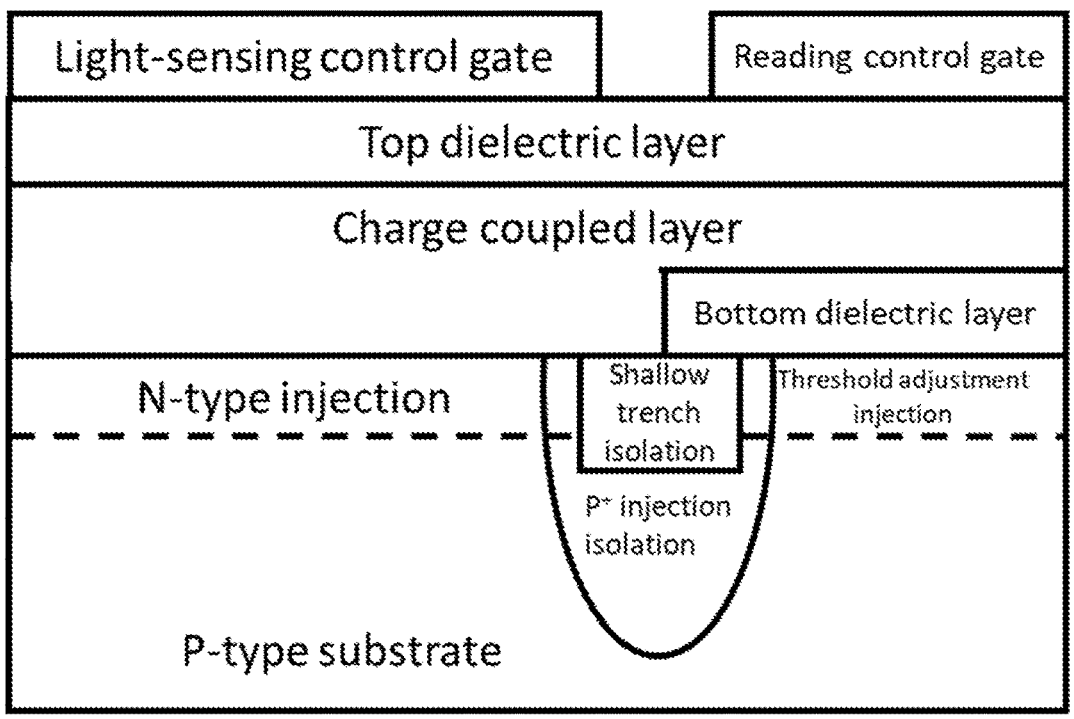
FIG. 8 is a second schematic structure diagram of the unit pixel of the double-gate structure of the detector.

In addition, the detector may also use a side-by-side double-gate structure. As shown in FIGS. 7 and 8, the light-sensing control gate is used during the light sensing, and the reading control gate is used during the reading. By reducing the area of the reading control gate without changing the total area of the light-sensing control gate and the reading control gate, the sensitivity of the unit pixel of the photosensitive detector can be greatly improved without reducing the full-well charges.

The charge coupled layer of the detector is made of polycrystalline silicon, metal or other electronic conductors. Only the conductors can well couple the photo-charges sensed by the light-sensing MOS-C portion so that the reading MOSFET portion reads the photo-charges collected in channels by the light-sensing MOS-C portion. The control gate is made of polycrystalline silicon, metal or transparent conducting electrodes, so that it is convenient for applying the voltage for exposure and reading. At least one of the control gate and the P-type semiconductor substrate in the composite dielectric gate MOS-C portion for sensing light is a transparent or translucent window which is provided for the detector to detect the wavelength, so that light can be incident into the depletion region to realize the detection of light. The bottom dielectric layer may be made of silicon oxide, SiON or other dielectrics with a high dielectric constant, and the top dielectric layer may be made of silicon oxide/silicon nitride/silicon oxide, silicon oxide/aluminum oxide/silicon oxide, silicon oxide, aluminum oxide or other dielectrics with a high dielectric constant. The bottom dielectric layers and the top dielectric layers in the composite dielectric gate MOS-C portion and the composite dielectric gate MOSFET portion may be made of the same material or different materials. The two insulating dielectric layers (i.e., the bottom dielectric layer and the top dielectric layer) should be thick enough to effectively prevent the electrons in the control gate and the substrate from tunneling the charge coupled layer to thus influence the function of the charge coupled layer.

Figure 9:
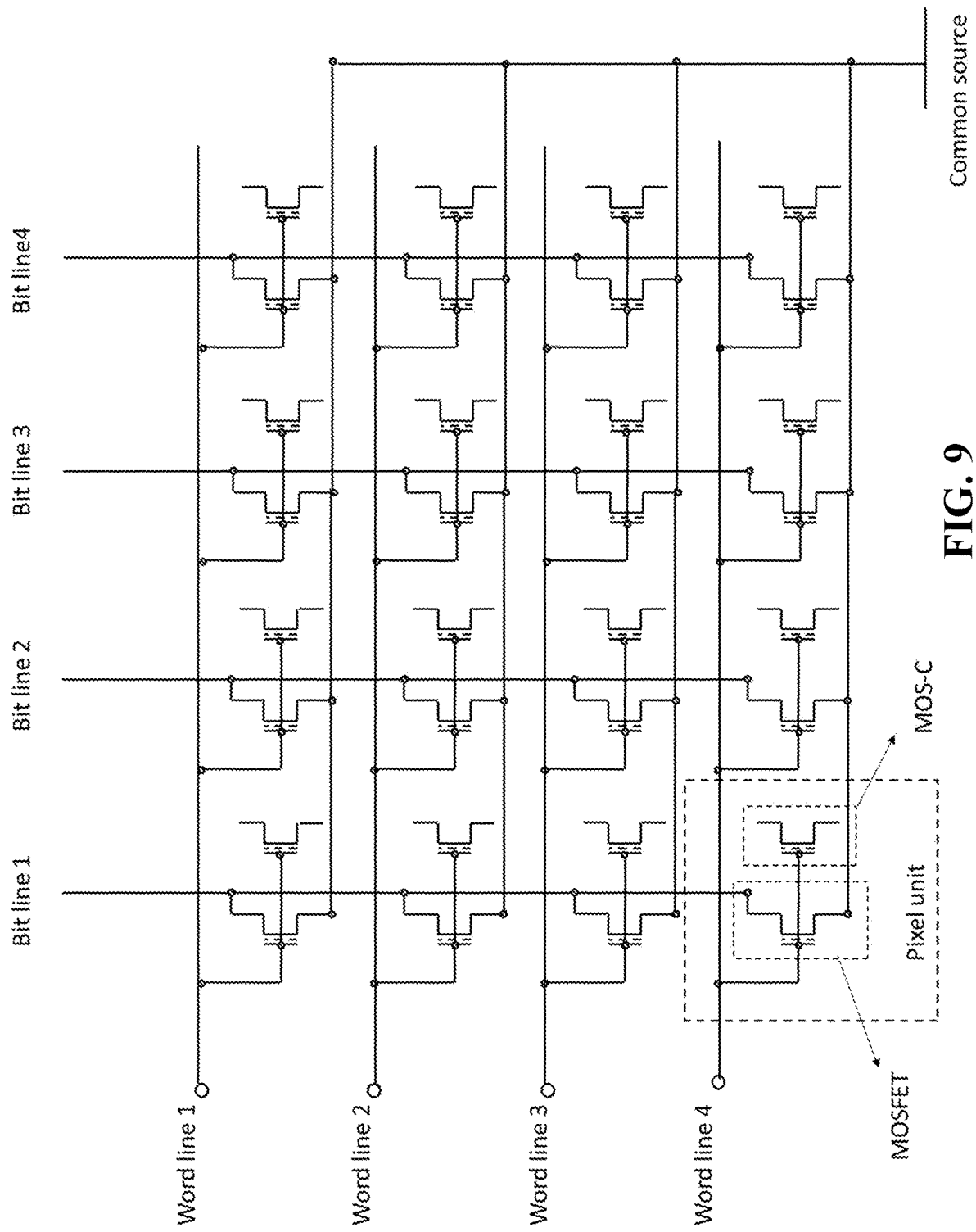
FIG. 9 is a schematic diagram of interconnection in a detector array.
Figure 10:
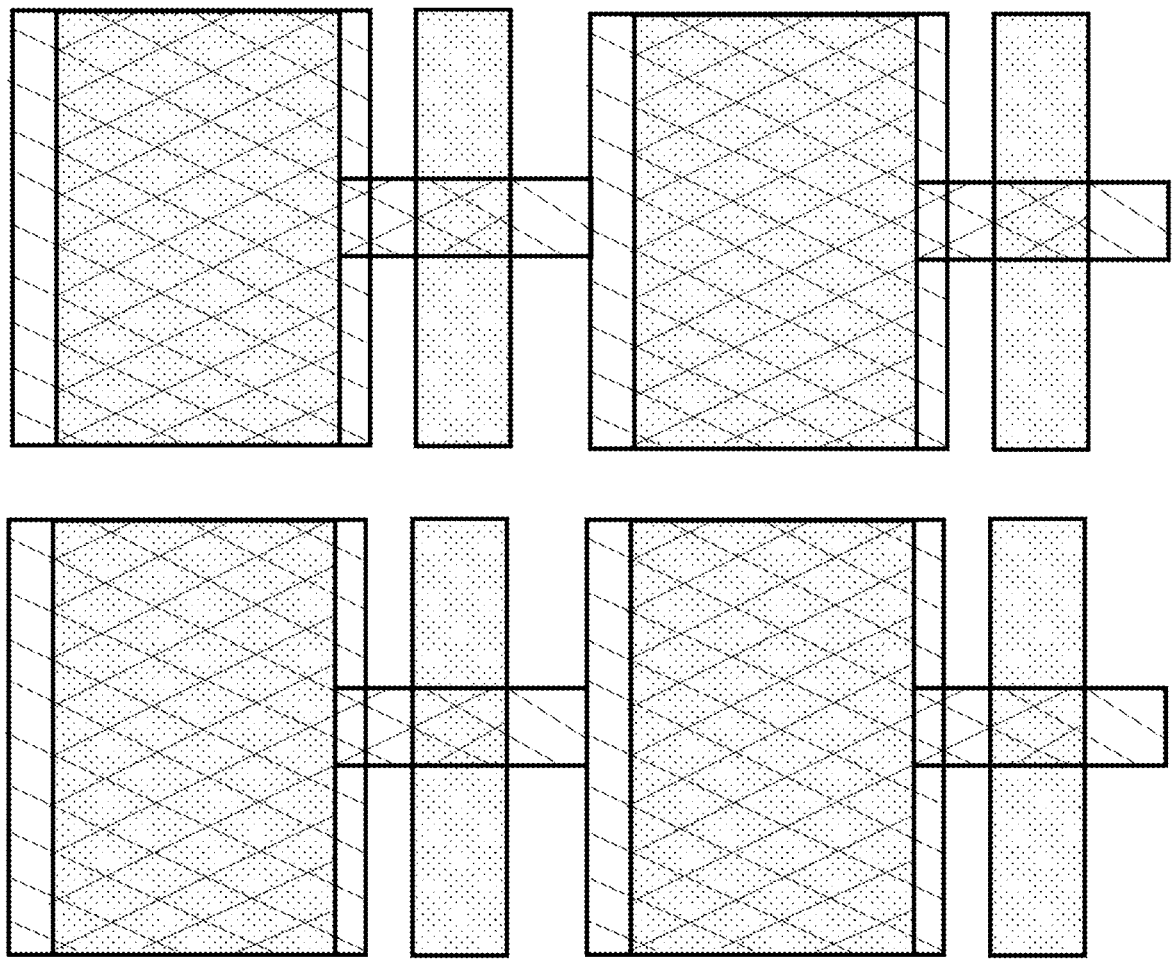
FIG. 10 is a layout diagram of the detector array.
Figure 11:
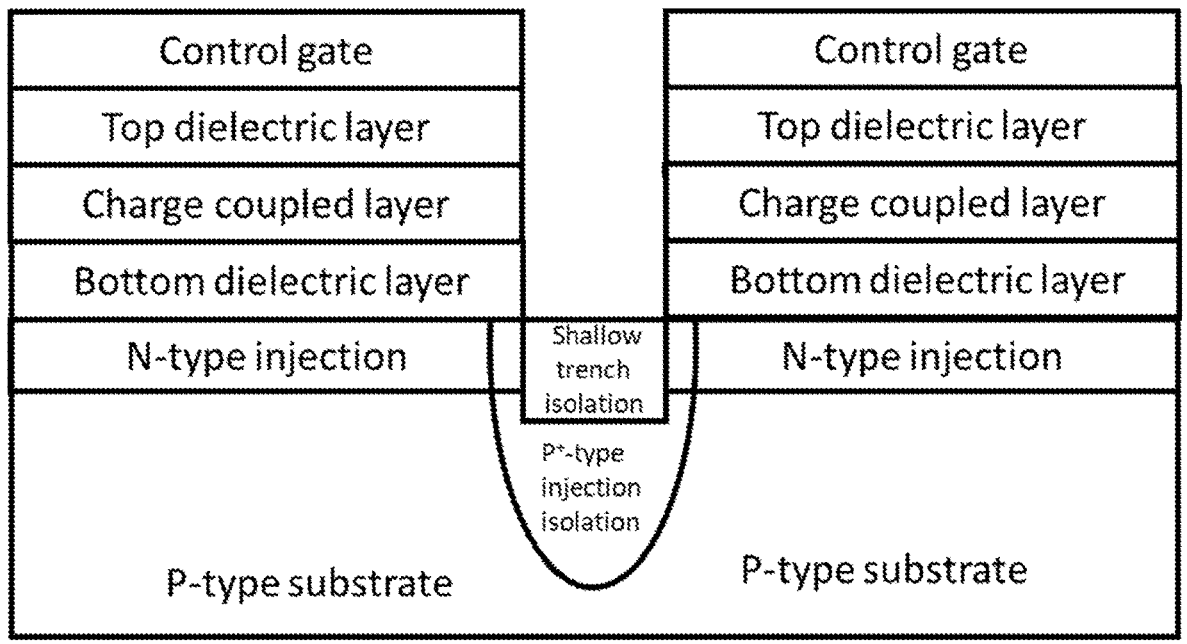
FIG. 11 is a first schematic diagram of the isolation between light-sensing MOS-C portions.
Figure 12:
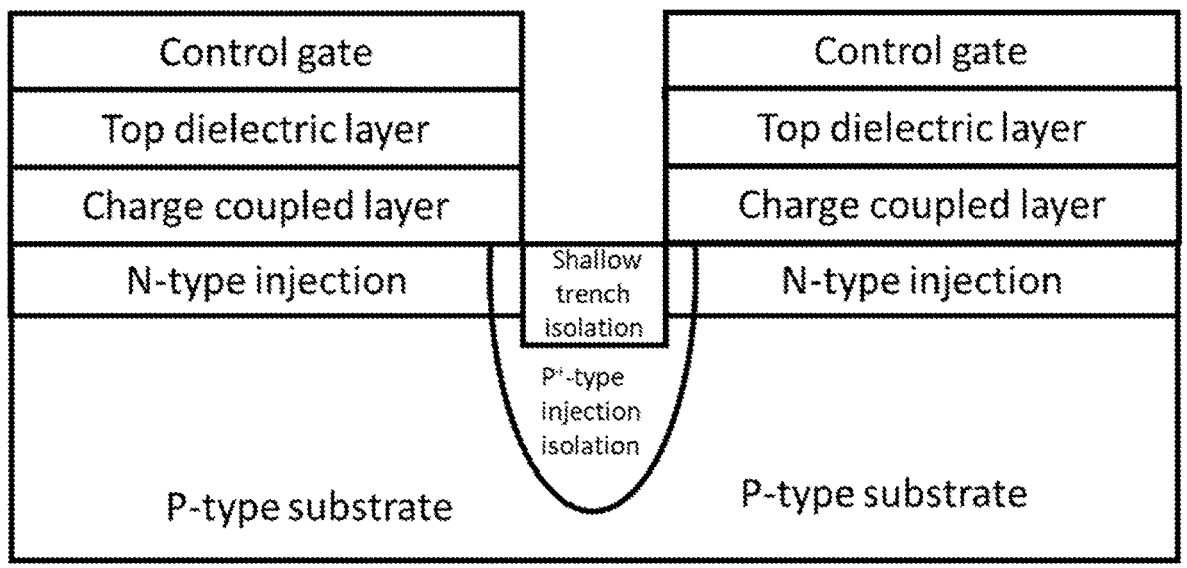
FIG. 12 is a second schematic diagram of the isolation between light-sensing MOS-C portions.
Figure 13:
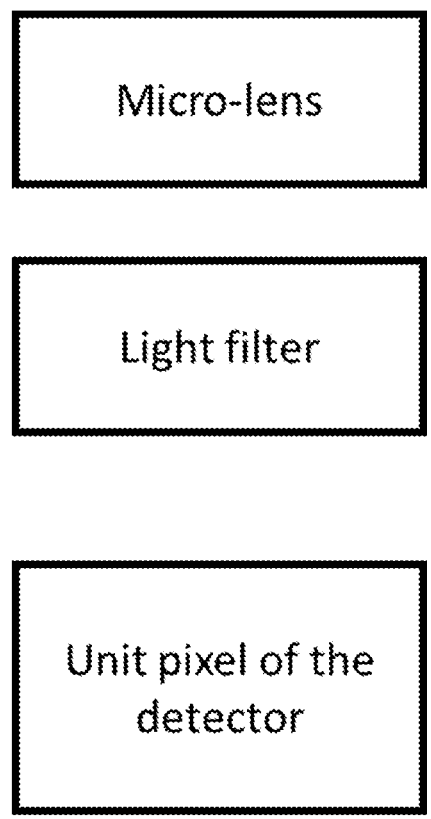
FIG. 13 is a schematic diagram of the arrangement of a light filter and a micro-lens on a unit pixel.

The charge-coupled photosensitive detector units having the composite dielectric gate MOS-C portion and the composite dielectric gate MOSFET portion can form a detector array. In the detector array, the composite dielectric gate MOSFET portions are interconnected by an NOR architecture of a flash memory, so that it is convenient for performing X-Y addressing by connecting lines of the control gates and connecting lines of drains which are perpendicular to each other. Meanwhile, the common source region of the reading transistors is grounded during exposure, so that the reading transistors with the common source can be effectively prevented from influencing the exposure. FIG. 9 shows a schematic diagram of the interconnection in the detector array, wherein the large dashed box shows a pixel unit, the MOSFET portions for reading are interconnected by the NOR architecture of the flash memory, and the MOS-C portions for sensing light are independent of each other. FIG. 10 shows a layout diagram of the detector array. In the detector array, the composite dielectric gate MOS-C portions for sensing light are isolated by deep trench isolation and P$^+$-type injection to prevent the crosstalk between unit pixels, as shown in FIGS. 11 and 12.

A light filter and a micro-lens may be successively stacked above the unit pixel of the detector. In the array, the reduction of a color image is realized by an arrangement mode, for example, a Bayer pattern.

Figure 14:
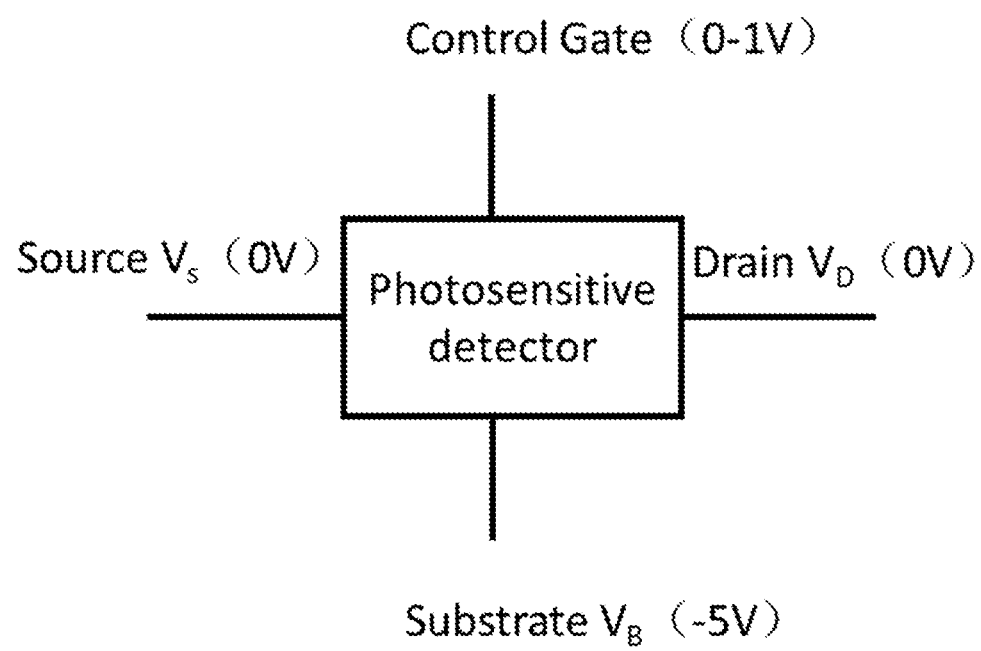
FIG. 14 is a schematic diagram of applying a voltage during the collection and storage of photoelectrons by a unit pixel of the detector.

The step of collecting and storing photoelectrons by the charge-coupled photosensitive detector having the composite dielectric gate MOS-C portion and the composite dielectric gate MOSFET portion will be described below. FIG. 14 shows a schematic diagram of applying a voltage during the collection and storage of photoelectrons by the photosensitive detector. A zero bias pulse or a very small positive bias pulse (e.g., 0V to 1V) is applied to the control gate in the MOS-C portion or in the MOSFET portion, and a negative bias pulse (e.g., −5V to 0V) is applied to the P-type semiconductor substrate, so that a depletion layer is formed in the P-type semiconductor. When photons reach the depletion region, if the energy of photons hv is greater than that of the semiconductor Eg (or, Eg+ΔEc), the photons will be adsorbed by the semiconductor and an electron-hole pair will be excited. The photoelectrons are moved, due to a gate voltage, to an interface between the P-type semiconductor substrate and the bottom dielectric later or an interface between the P-type semiconductor substrate and the N-type injection layer. After the photoelectrons are stored at the interface, potential at the interface will change, and the change in potential will cause change in potential of the charge coupled layer by charge coupling, so that the composite dielectric gate MOSFET portion used for reading generates a drift in threshold voltage. By measuring the change in threshold voltage at the composite dielectric gate MOSFET portion before and after exposure, the number of collected photoelectrons in channels is determined. In the photoelectron collection stage, a zero bias is applied to the source region and the drain region in the composite dielectric gate MOSFET portion, so that the composite dielectric gate MOSFET portion will not influence the collection of photoelectrons.

Figure 15:
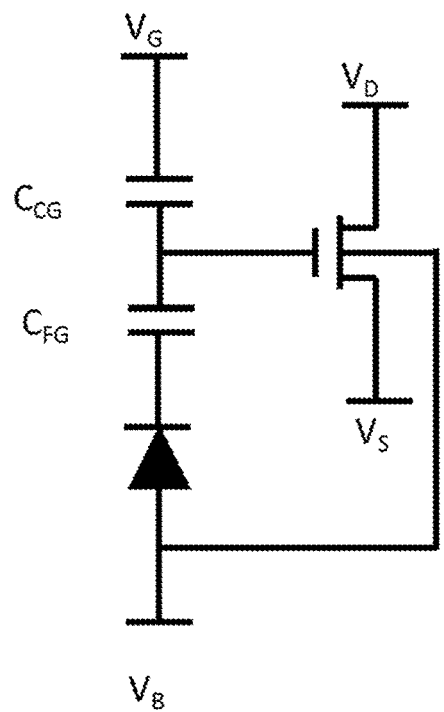
FIG. 15 is a first equivalent circuit diagram of a unit pixel of the detector.
Figure 16:
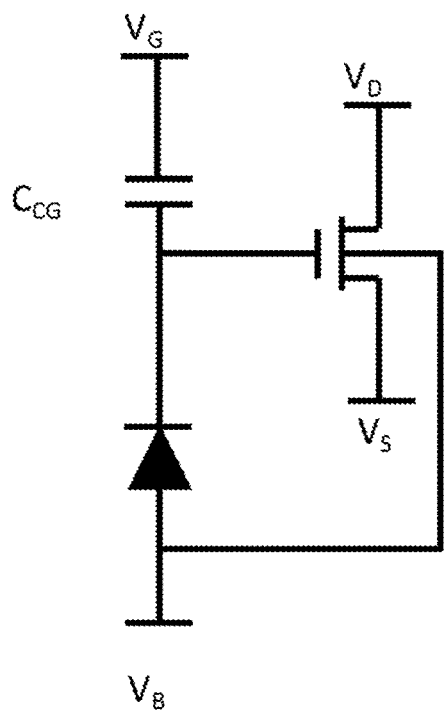
FIG. 16 is a second equivalent circuit diagram of the unit pixel of the detector.

Since the composite dielectric gate MOS-C portion for sensing light and the composite dielectric gate MOSFET portion for reading share the charge coupled layer, the change in potential of the charge coupled layer caused by the composite dielectric gate MOS-C portion during exposure may be measured by the composite dielectric gate MOSFET portion. FIGS. 15 and 16 show equivalent circuit diagrams of the charge-coupled photosensitive detector having the composite dielectric gate MOS-C portion and the composite dielectric gate MOSFET portion. The substrate in the light-sensing MOS-C portion of the photosensitive detection is equivalent to a photodiode, $C_{CGtotal}$ is the sum of the capacitance between the control gate in the MOS-C portion and the charge coupled layer and the capacitance between the control gate in the MOSFET portion and the charge coupled layer, and $C_{FG}$ is the capacitance between the substrate in the composite dielectric gate MOS-C portion and the charge coupled layer. The relation between the amount of change in threshold voltage at the reading MOSFET portion and the number of collected photoelectrons is expressed by:

$$\Delta V_G = -\frac{Nq}{C_{CGtotal}} \cdot \frac{C_{FG} + C_{CGtotal}}{C_{CGtotal}}$$

where $\Delta V_G$ is the amount of change in threshold voltage before and after exposure, q is the quantity of charges of the electrons, and N is the number of the collected photoelectrons.

Figure 17:
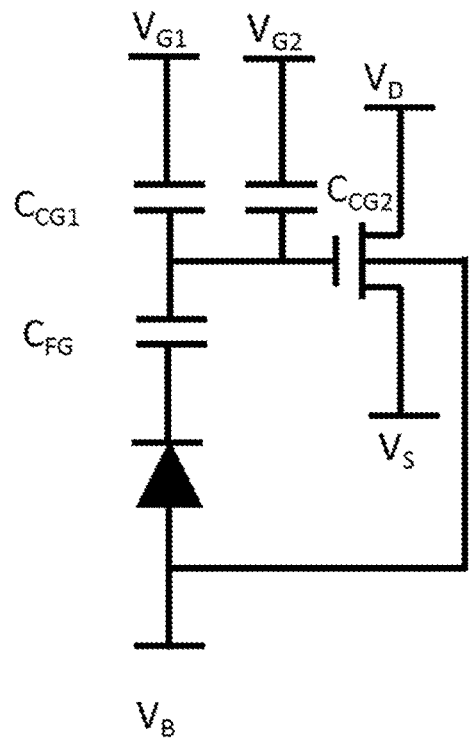
FIG. 17 is a first equivalent circuit diagram of a unit pixel of a double-gate structure of the detector.
Figure 18:
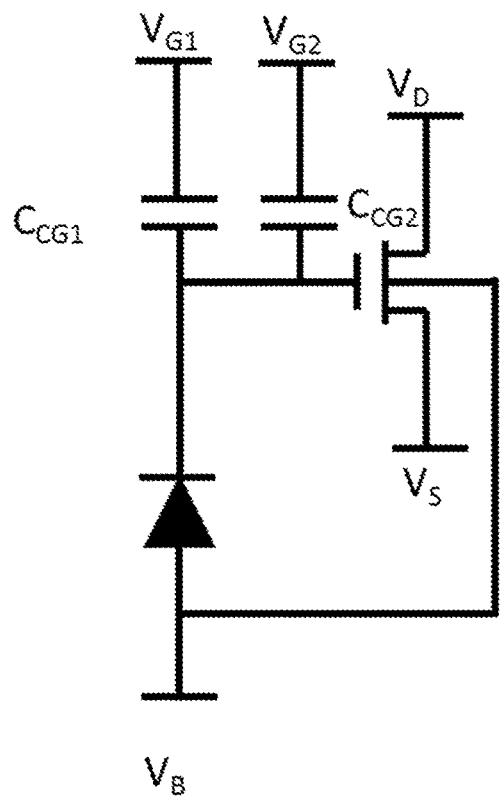
FIG. 18 is a second equivalent circuit diagram of the unit pixel of the double-gate structure of the detector.

The reading sensitivity can be improved by the double-gate structure (having a light-sensing control gate and a reading control gate) shown in FIGS. 17 and 18. FIG. 9 shows an equivalent circuit diagram of the photosensitive detector of the double-gate structure. $V_{G1}$ is the voltage at the light-sensing control gate, $V_{G2}$ is the voltage at the reading control gate, $C_{CG1}$ is the capacitance between the light-sensing control gate and the charge coupled layer, and $C_{CG2}$ is the capacitance between the reading control gate and the charge coupled layer. In this embodiment, by applying a voltage to the reading control gate, the threshold voltage at the MOSFET portion can be read by the reading control gate. The relation between the amount of change in threshold voltage and the number of collected photoelectrons is expressed by:

$$\Delta V_{G2} = -\frac{Nq}{C_{CG2}} \cdot \frac{C_{FG} + C_{CGtotal}}{C_{CGtotal}}$$

where $\Delta V_{G2}$ is the amount of change in threshold voltage at the MOSFET portion read by the reading control gate before and after exposure, and $C_{CGtotal} = C_{CG1} + C_{CG2}$.

The full-well charge is expressed by:

$$Q = \frac{C_{CGtotal} C_{FG}}{C_{CGtotal} + C_{FG}} \cdot \Delta V_S,$$

where $\Delta V_S$ is the maximum amount of change in surface potential of the channels in the MOS-C portion.

It can be known from the above formula that, by reducing the area of the reading control gate without changing the total area of the light-sensing control gate and the reading control gate (i.e., by reducing $C_{CG2}$ without changing $C_{CGtotal}$) the reading sensitivity can be improved without reducing the full-well charges.

Figure 19:
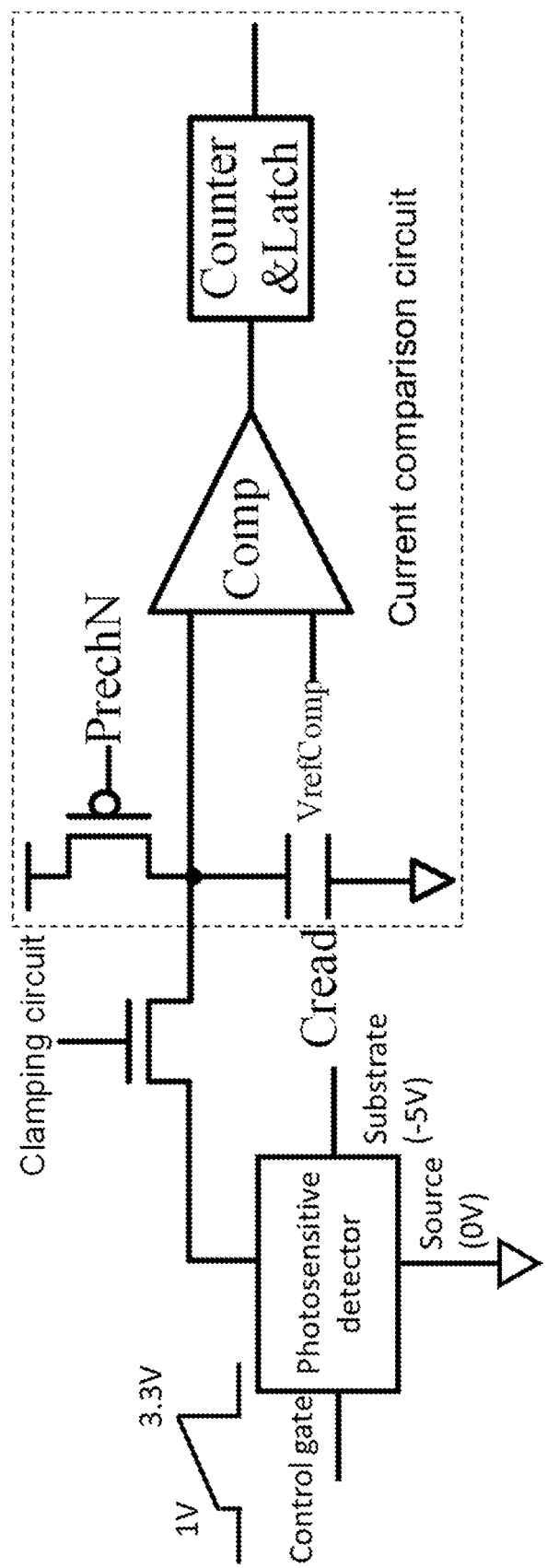
FIG. 19 is a circuit diagram of a first reading and amplification method of the detector.

First photoelectron reading and amplification method: a zero bias is applied to the source region of the composite dielectric gate MOSFET portion, the voltage at the P-type semiconductor substrate is the same as the voltage at the P-type semiconductor substrate during the collection and storage of photoelectrons, an appropriate positive voltage (e.g., above 0.1V) is applied to the drain region, and a gradually-varied ramp voltage (e.g., a ramp voltage from 1V to 3V) is applied to the light-sensing control gate or the reading control gate; and, the current in the drain region is measured, and the magnitude of the gate voltage when the current in the drain region reaches a given current value (e.g., 1 µA) is recorded. FIG. 19 shows a circuit diagram of this reading and simplification method. Actually, the time when the current reaches the given current value (e.g., 1 µA) is obtained, by comparing the current in the drain region, through a current comparison circuit; and the magnitude of the voltage at the control gate can be obtained by the time and the slope of the ramp voltage applied to the control gate. The obtained gate voltage is the threshold voltage at the composite dielectric gate MOSFET portion.

The operating process of the current comparison circuit is as follows: Cread is charged by PrechN, a ramp voltage from a small one to a large one is applied to WL, and the counter begins to count; when the voltage at the WL is equal to the threshold voltage at the pixel unit, the reading capacitor Cread in the reading circuit beings to discharge, the comparator controls the counter to stop counting, and the value in the counter is equal to the threshold voltage at the pixel unit.

The relation between the amount of change in the threshold voltage before and after exposure and the number of photoelectrons is expressed by:

$$\Delta V_G = -\frac{Nq}{C_{CG}} \cdot \frac{C_{FG} + C_{CGtotal}}{C_{CGtotal}}$$

where $\Delta V_G$ is the amount of change in voltage at the control gate before and after exposure when the current in the drain region reaches the given value, q is the quantity of charges of the electrons, N is the number of the collected photoelectrons, $C_{CGtotal}$ is the sum of the capacitance between the control gate in the MOS-C portion and the charge coupled layer and the capacitance between the control gate in the MOSFET portion and the charge coupled layer, $C_{CG}$ is the capacitance between the control gate in the MOS-C portion or the control gate in the MOSFET portion and the charge coupled layer, and $C_{FG}$ is the capacitance between the substrate in the composite dielectric gate MOS-C portion and the charge coupled layer.

Figure 20:
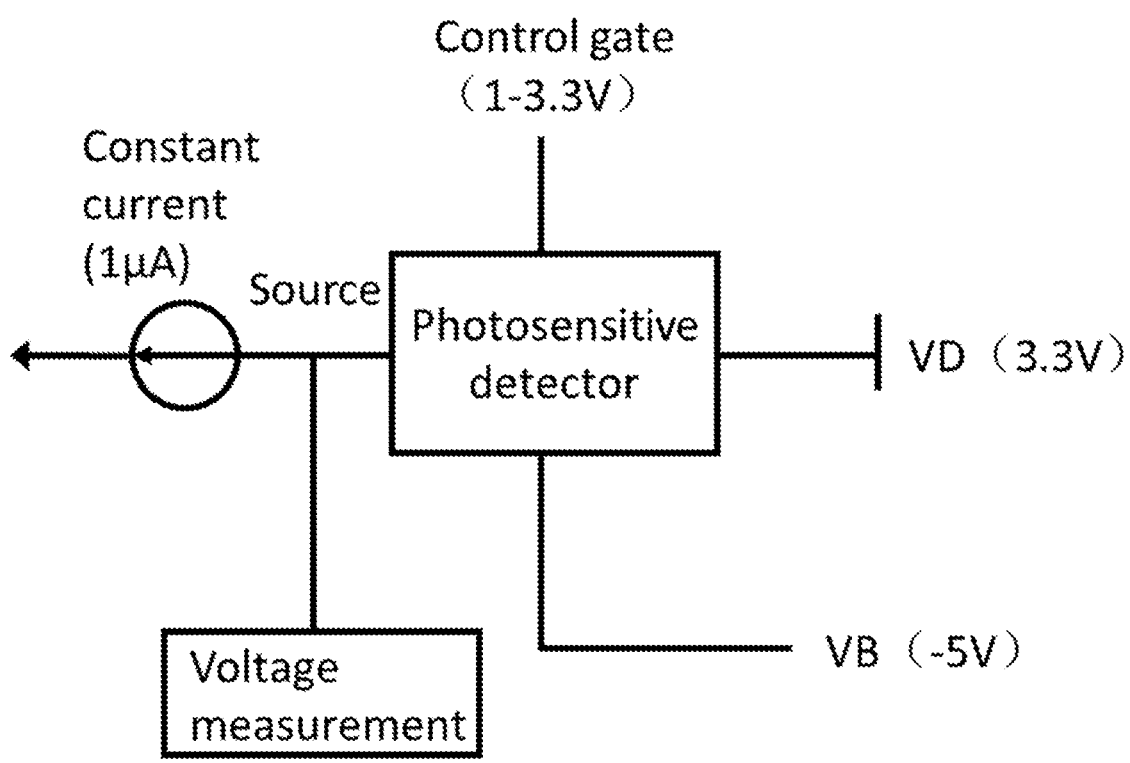
FIG. 20 is a circuit diagram of a second reading and amplification method of the detector.

Second photoelectron reading and amplification method: a power supply voltage (e.g., 3.3V) is applied to the drain region in the composite dielectric gate MOSFET portion, an appropriate positive voltage (e.g., 1V to 3.3V) is applied to the control gate in the MOS-C portion or the control gate in the MOSFET portion, the voltage at the P-type semiconductor substrate is the same as the voltage at the P-type semiconductor substrate during the collection and storage of photoelectrons, a constant current (e.g., 1 µA) is applied to the source region, and an output voltage from the source region is measured. FIG. 20 shows a circuit diagram of this reading and simplification method. The relation between the amount of change in the output voltage before and after exposure and the number of photoelectrons is expressed by:

$$\Delta V_{out} = V_G - \sqrt{\frac{2I}{\mu C_{ox}\left(\frac{W}{L}\right)}} + \frac{Nq}{C_{CG}} \cdot \frac{C_{FG} + C_{CGtotal}}{C_{CGtotal}}$$

where $\Delta V_{out}$ is the amount of change in the output voltage before and after exposure, q is the quantity of charges of the electrons, N is the number of the collected photoelectrons, I is the current in the source region, $C_{CGtotal}$ is the sum of the capacitance between the control gate in the MOS-C portion and the charge coupled layer and the capacitance between the control gate in the MOSFET portion and the charge coupled layer, $C_{CG}$ is the capacitance between the control gate in the MOS-C portion or the control gate in the MOSFET portion and the charge coupled layer, $C_{FG}$ is the capacitance between the substrate in the composite dielectric gate MOS-C portion and the charge coupled layer, µ is the electron mobility, $C_{ox}$ is the equivalent capacitance from the control gate in the MOS-C portion or the control gate in the MOSFET portion to the P-type semiconductor substrate, W is the gate width of the composite dielectric gate MOSFET portion, and L is the gate length of the composite dielectric gate MOSFET portion.

The method for resetting the charge-coupled photosensitive detector having the composite dielectric gate MOS-C portion and the composite dielectric gate MOSFET portion will be described. Since the electrons are collected in channels during the light sensing process, the photosensitive detector needs to reset after exposure and reading, that is, the electrons collected in the channels are discharged. During the actual operation, a negative bias (e.g., −1V to −3V) is applied to the control gate in the MOS-C portion or the control gate in the MOSFET portion of the detector, a zero bias is applied to the P-type semiconductor substrate, and the source region and the drain region in the composite dielectric gate MOSFET portion are grounded. Thus, the electrons stored in channels return to the substrate due to an electric field.

The invention claimed is:

1. A dual-device photosensitive detection unit based on a composite dielectric gate, comprising a composite dielectric gate MOS-C portion having a light sensing function and a composite dielectric gate MOSFET portion having an information reading function, the two portions being formed above a same P-type semiconductor substrate;

the composite dielectric gate MOS-C portion comprises a charge coupled layer, a first top dielectric layer and a first control gate which are all successively stacked above the P-type semiconductor substrate, wherein an N-type injection layer is formed in the P-type semiconductor substrate and below the charge coupled layer;

the composite dielectric gate MOSFET portion comprises a bottom dielectric layer, the charge coupled layer, a second top dielectric layer and a second control gate which are all successively stacked above the P-type semiconductor substrate, wherein an N-type source region and an N-type drain region are formed in the P-type semiconductor substrate and on a side close to the bottom dielectric layer, and a threshold adjustment injection region is formed in the P-type semiconductor substrate and below the bottom dielectric layer; and in the P-type semiconductor substrate, the N-type injection layer is isolated from the N-type source region and the N-type drain region by a shallow trench isolation region and a $P^+$-type injection region.

2. The dual-device photosensitive detection unit based on a composite dielectric gate according to claim 1, characterized in that the composite dielectric gate MOS-C portion further comprises a first bottom dielectric layer which is disposed above the P-type semiconductor substrate and below the charge coupled layer.

3. The dual-device photosensitive detection unit based on a composite dielectric gate according to claim 2, characterized in that the first bottom dielectric layer and the bottom dielectric layer in the composite dielectric gate MOSFET portion are connected to form an integral structure or are two independent parts, and the first top dielectric layer and the second top dielectric layer are connected to form an integral structure or are two independent parts.

4. The dual-device photosensitive detection unit based on a composite dielectric gate according to claim 1, characterized in that the first control gate and the second control gate are connected to form an integral structure.

5. The dual-device photosensitive detection unit based on a composite dielectric gate according to claim 1, characterized in that the first control gate and the second control gate are of a side-by-side double-gate structure, wherein the first control gate is a light-sensing control gate and the second control gate is a reading control gate.

6. The dual-device photosensitive detection unit based on a composite dielectric gate according to claim 1, characterized in that the area of the P-type semiconductor substrate and the charge coupled layer in the composite dielectric gate MOS-C portion is greater than the area of the P-type semiconductor substrate and the charge coupled layer in the composite dielectric gate MOSFET portion.

7. The dual-device photosensitive detection unit based on a composite dielectric gate according to claim 1, characterized in that the charge coupled layer is made of one of polycrystalline silicon, metal or other electronic conductors; the first control gate or the second control gate is made of one of polycrystalline silicon, metal or transparent conducting electrodes; the bottom dielectric layer is made of one of silicon oxide, SiON or other dielectrics with a high dielectric constant; and, the first top dielectric layer or the second top dielectric layer is made of one of silicon oxide/silicon nitride/silicon oxide, silicon oxide/aluminum oxide/silicon oxide, silicon oxide, aluminum oxide or other dielectrics with a high dielectric constant.

8. A detector using the dual-device photosensitive detection unit based on a composite dielectric gate according to claim 1, characterized in that a plurality of the dual-device photosensitive detection units are arranged on a same P-type semiconductor substrate in form of an array to obtain a detector, wherein deep trench isolation regions and $P^+$-type injection regions are formed between the composite dielectric gate MOS-C portions to isolate the photosensitive detection units; the composite dielectric gate MOSFET portions are interconnected by an NOR architecture of a flash memory; connecting lines of the second control gates and connecting lines of the N-type drain regions are perpendicular to each other and used for performing X-Y addressing; and, the common N-type source region is grounded during exposure.

9. The detector according to claim 8, characterized in that a light filter layer is adhered onto each photosensitive detection unit of the detector, and a micro-lens is adhered onto each light filter layer.

10. The detector according to claim 8, characterized in that at least one of the P-type semiconductor substrate and the first control gate in the composite dielectric gate MOS-C portion has a transparent or translucent window which is provided for the detector to detect light.

11. A detection method using the detector according to claim 8, characterized in that photosensitive photoelectrons are collected, stored and read by the composite dielectric gate MOS-C portion and the composite dielectric gate MOSFET portion, and change in potential of the charge coupled layer caused by the composite dielectric gate MOS-C portion during exposure can be measured by the composite dielectric gate MOSFET portion; and, the P-type semiconductor substrate in the composite dielectric gate MOS-C portion senses light and then couples photoelectrons to the charge coupled layer, and photoelectronic signals are read by the composite dielectric gate MOSFET portion.

12. The detection method according to claim 11, characterized in that the first control gate and the second control gate are connected to form an integral structure, or the first control gate and the second control gate are of a side-by-side double-gate structure, wherein the first control gate is a light-sensing control gate used for sensing light, and the second control gate is a reading control gate used for reading photoelectronic signals.

13. The detection method according to claim 11, characterized in that, during collection of photoelectrons, a zero bias pulse or a very small positive bias pulse is applied to the first control gate or the second control gate, and a negative bias pulse is applied to the P-type semiconductor substrate, so that a depletion layer is formed in the P-type semiconductor substrate; when light is incident into the depletion layer and photons are adsorbed by the semiconductor, photoelectrons are generated and moved, due to a gate voltage, to an upper surface of the P-type semiconductor substrate or to an interface between the P-type semiconductor substrate and the N-type injection layer; after the photoelectrons are stored at the interface, potential at the interface will change, and the change in potential will cause change in potential of the charge coupled layer by charge coupling, so that the composite dielectric gate MOSFET portion used for reading generates a drift in threshold voltage; by measuring change in threshold voltage at the composite dielectric gate MOSFET portion before and after exposure, the number of collected photoelectrons in channels is determined; and, in the photoelectron collection stage, a zero bias is applied to the N-type source region and the N-type drain region in the composite dielectric gate MOSFET portion, so that the composite dielectric gate MOSFET portion will not influence the collection of photoelectrons.

14. The detection method according to claim 11, characterized in that, during the reading of photoelectronic signals, a zero bias is applied to the N-type source region in the composite dielectric gate MOSFET portion, the voltage at the P-type semiconductor substrate is the same as the voltage at the P-type semiconductor substrate during the collection and storage of photoelectrons, a positive voltage is applied to the N-type drain region, and a gradually-varied ramp voltage is applied to the first control gate or the second control gate; the current in the N-type drain region is measured, and the magnitude of the gate voltage when the current in the N-type drain region reaches a given current value is recorded, where the gate voltage is a threshold voltage for the composite dielectric gate MOSFET portion; and, the relation between an amount of change in the threshold voltage before and after exposure and the number of photoelectrons is expressed by:

$$\Delta V_G = -\frac{Nq}{C_{CG}} \cdot \frac{C_{FG} + C_{CGtotal}}{C_{CGtotal}}$$

where $\Delta V_G$ is the amount of change in voltage at the first control gate or the second control gate before and after exposure when the current in the drain region reaches the given value, q is the quantity of charges of the electrons, N is the number of the collected photoelectrons, $C^{CG}$ is the capacitance between the first control gate or the second control gate and the charge coupled layer, $C_{CGtotal}$ is the sum of the capacitance between the first control gate and the charge coupled layer and the capacitance between the second control gate and the charge coupled layer, and $C_{FG}$ is the capacitance between the P-type semiconductor substrate in the composite dielectric gate MOS-C portion and the charge coupled layer.

15. The detection method according to claim 11, characterized in that, during the reading of photoelectronic signals, a power supply voltage is applied to the N-type drain region in the composite dielectric gate MOSFET portion, a positive voltage is applied to the first control gate or the second control gate, the voltage at the P-type semiconductor substrate is the same as the voltage at the P-type semiconductor substrate during the collection and storage of photoelectrons, and a constant current is applied to the N-type source region; an output voltage from the N-type source region is measured; and, the relation between an amount of change in the output voltage before and after exposure and the number of photoelectrons is expressed by:

$$\Delta V_{out} = V_G - \sqrt{\frac{2I}{\mu C_{ox}\left(\frac{W}{L}\right)}} + \frac{Nq}{C_{CG}} \cdot \frac{C_{FG} + C_{CGtotal}}{C_{CGtotal}}$$

where $\Delta V_{out}$ is the amount of change in the output voltage before and after exposure, q is the quantity of charges of the electrons, N is the number of the collected photoelectrons, I is the current in the source region, $C_{CG}$ is the capacitance between the first control gate or the second control gate and the charge coupled layer, $C_{CGtotal}$ is the sum of the capacitance between the first control gate and the charge coupled layer and the capacitance between the second control gate and the charge coupled layer, $C_{FG}$ is the capacitance between the P-type semiconductor substrate in the composite dielectric gate MOS-C portion and the charge coupled layer, μ is the electron mobility, $C_{ox}$ is the equivalent capacitance from the first control gate or the second control gate to the P-type semiconductor substrate, W is the gate width of the composite dielectric gate MOSFET portion, and L is the gate length of the composite dielectric gate MOSFET portion.

16. The detection method according to claim 1, characterized in that, after the photoelectronic signals are read, the sensed photoelectrons are reset; and, a negative bias is applied to the first control gate or the second control gate of the detector, a zero bias is applied to the P-type semiconductor substrate, and the N-type source region and the N-type drain region in the composite dielectric gate MOSFET portion are grounded so that the electrons stored in channels return to the substrate due to an electric field.

* * * * *